(12) United States Patent
Huang

(10) Patent No.: US 9,501,111 B1
(45) Date of Patent: Nov. 22, 2016

(54) TRANSVERSE FAN ASSEMBLY

(71) Applicant: Cheng Yu Huang, New Taipei (TW)

(72) Inventor: Cheng Yu Huang, New Taipei (TW)

( * ) Notice: Subject to any disclaimer, the term of this patent is extended or adjusted under 35 U.S.C. 154(b) by 59 days.

(21) Appl. No.: 14/709,629

(22) Filed: May 12, 2015

(51) Int. Cl.
| | |
|---|---|
| *G06F 1/20* | (2006.01) |
| *F04D 29/28* | (2006.01) |
| *F04D 29/42* | (2006.01) |
| *F04D 29/70* | (2006.01) |
| *F04D 25/06* | (2006.01) |
| *F04D 25/08* | (2006.01) |
| *H05K 7/20* | (2006.01) |

(52) U.S. Cl.
CPC ........... *G06F 1/203* (2013.01); *F04D 25/0693* (2013.01); *F04D 25/08* (2013.01); *F04D 29/283* (2013.01); *F04D 29/4246* (2013.01); *F04D 29/703* (2013.01); *H05K 7/20172* (2013.01)

(58) Field of Classification Search
CPC ...................... H05K 7/20136; H05K 7/20172; G06F 1/20; G06F 1/203; G06F 1/1623; G06F 2200/201; F04D 25/0693; F04D 25/08; F04D 29/283; F04D 29/4246; F04D 29/703
USPC ........................ 361/694–695, 679.46–679.55; 174/16.1; 165/121; 55/274, 328, 415, 55/418, 471, 473, 481, 506; 454/202
See application file for complete search history.

(56) References Cited

U.S. PATENT DOCUMENTS

| | | | | |
|---|---|---|---|---|
| 5,244,434 A * | 9/1993 | Stoney | ..................... | F24F 13/18 454/213 |
| 5,660,605 A * | 8/1997 | Chan | .................. | B01D 46/0005 454/202 |
| 6,738,256 B2 * | 5/2004 | Hsieh | ...................... | G06F 1/203 165/121 |
| 7,789,129 B1 * | 9/2010 | Barden | ............... | F24D 19/0087 165/121 |
| 7,800,903 B2 * | 9/2010 | Wang | .................... | G06F 1/1632 361/679.48 |
| 8,155,797 B2 * | 4/2012 | Wiese | ..................... | F24F 7/013 700/278 |
| 8,315,044 B2 * | 11/2012 | Wu | ....................... | G06F 1/1624 312/323 |
| 8,864,447 B1 * | 10/2014 | Humphrey | .............. | F04D 17/04 415/118 |
| 8,902,585 B2 * | 12/2014 | Tseng | .................... | G06F 1/1607 361/679.09 |
| 9,395,773 B1 * | 7/2016 | Huang | .................... | G06F 1/203 |
| 2006/0114653 A1 * | 6/2006 | Seto | ........................ | G06F 1/203 361/695 |
| 2010/0038223 A1 * | 2/2010 | Laurent | .................. | H01H 13/70 200/310 |
| 2010/0134977 A1 * | 6/2010 | Chang | .................... | G06F 1/203 361/695 |
| 2010/0226088 A1 * | 9/2010 | Huang | .................... | G06F 1/203 361/679.48 |
| 2013/0201625 A1 * | 8/2013 | Liang | .................... | G06F 1/1683 361/679.55 |

\* cited by examiner

*Primary Examiner* — Zachary M Pape
*Assistant Examiner* — Amir Jalali
(74) *Attorney, Agent, or Firm* — Jackson IPG PLLC; Demian K. Jackson

(57) ABSTRACT

A fan assembly includes a housing including two first slits on a bottom; a mount on the housing and including two second slits aligned with the first slits; a louver on the housing and including openings and at least one outtake between the louver and a front of the housing; first and second side caps for fastening the housing and the louver together; a PCB on a side of the housing; an exposed touch screen adjacent to the PCB and configured to activate the PCB; a transverse fan in the mount and electrically connected to the PCB; two pivotal members each including two opposite projections slidably disposed in the first and second slits; and two auxiliary supports on the at least one outtake, each auxiliary support including a shaft rotatably disposed in the pivotal member, and slots.

1 Claim, 7 Drawing Sheets

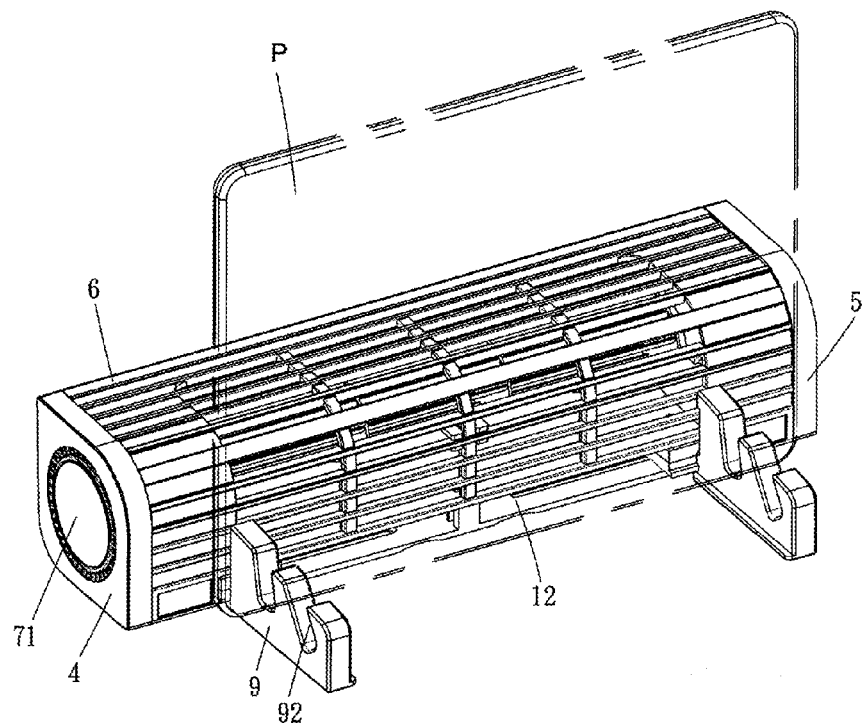
Fig. 10
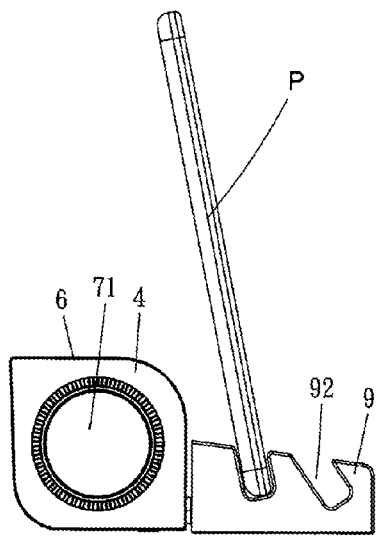 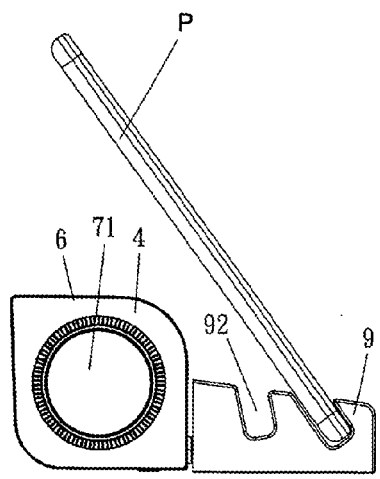
Fig. 11  Fig. 12

TRANSVERSE FAN ASSEMBLY

BACKGROUND OF THE INVENTION

1. Field of the Invention

The invention relates to mechanical fans and more particularly to a small transverse fan assembly for cooling a laptop or tablet computer.

2. Description of Related Art

Laptops are widely used by people for various works. However, heat may quickly build up when a laptop is operating. How to effectively dissipate the heat is thus an issue to be addressed. A great number of after market cooling pads for laptop are commercially available.

While the laptop cooling pad enjoys its success in the market, continuing improvements in the exploitation of mechanical fans for cooling a laptop or even a tablet are constantly sought.

SUMMARY OF THE INVENTION

It is therefore one object of the invention to provide a fan assembly comprising a housing having an open top and an open front and including two first slits on a bottom; a mount disposed on the bottom of the housing and including two second slits on a bottom, the second slits being aligned with the first slits; a louver disposed on the top and the front of the housing and including a plurality of openings and at least one outtake formed between the louver and the front of the housing; first and second side caps for fastening the housing and the louver together; a PCB disposed on a side of the housing; an exposed touch screen adjacent to the PCB and configured to activate the PCB; a transverse fan disposed in the mount and electrically connected to the PCB; two pivotal members each including two opposite projections slidably disposed in the first and second slits; and two auxiliary supports disposed on the at least one outtake, each of the auxiliary supports including a shaft configured to rotate in one of the pivotal members, and a plurality of slots.

The above and other objects, features and advantages of the invention will become apparent from the following detailed description taken with the accompanying drawings.

BRIEF DESCRIPTION OF THE DRAWINGS

FIG. 10 is a perspective view of the transverse fan assembly with a tablet computer disposed across one set of the aligned slots of the auxiliary supports;

FIG. 11 is a side elevation of FIG. 10; and

FIG. 12 is another side elevation showing the tablet computer disposed across the other set of the aligned slots of the auxiliary supports.

DETAILED DESCRIPTION OF THE INVENTION

Figure 1:
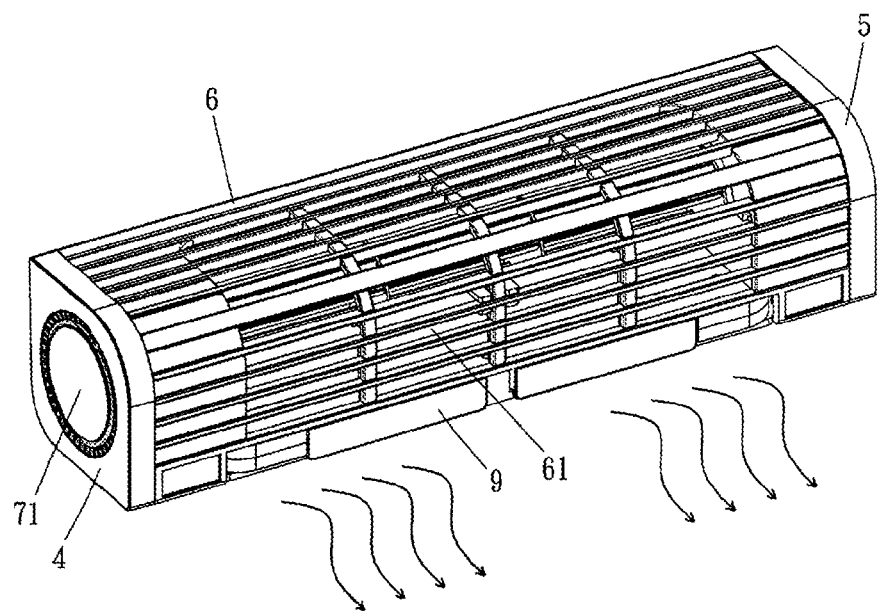
FIG. 1 is a perspective view of a transverse fan assembly according to the invention viewing from the front.
Figure 2:
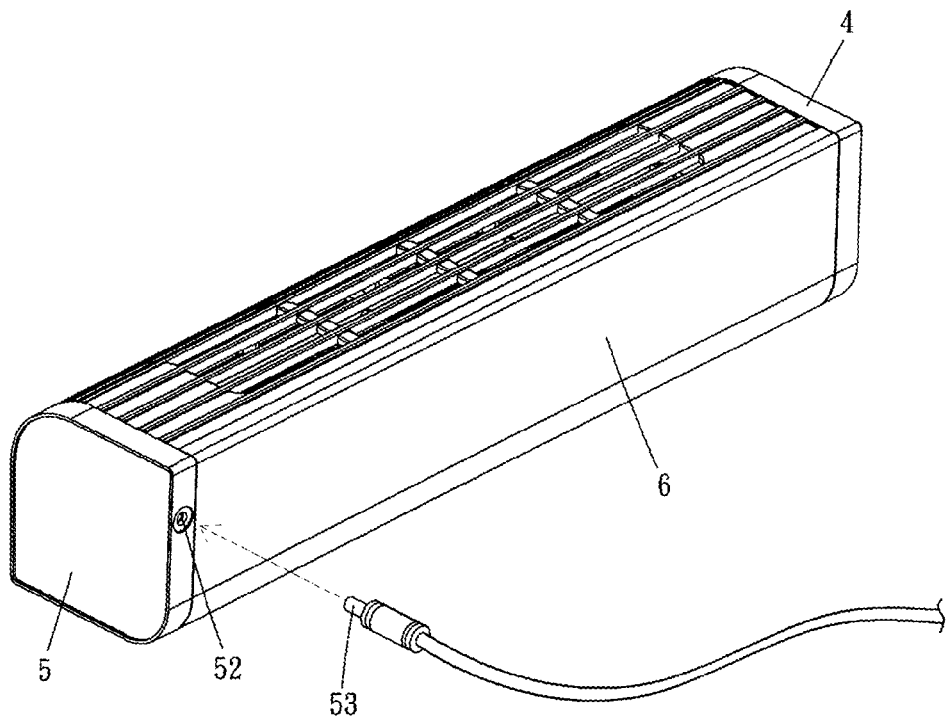
FIG. 2 is another perspective view of the transverse fan assembly viewing from the rear.
Figure 3:
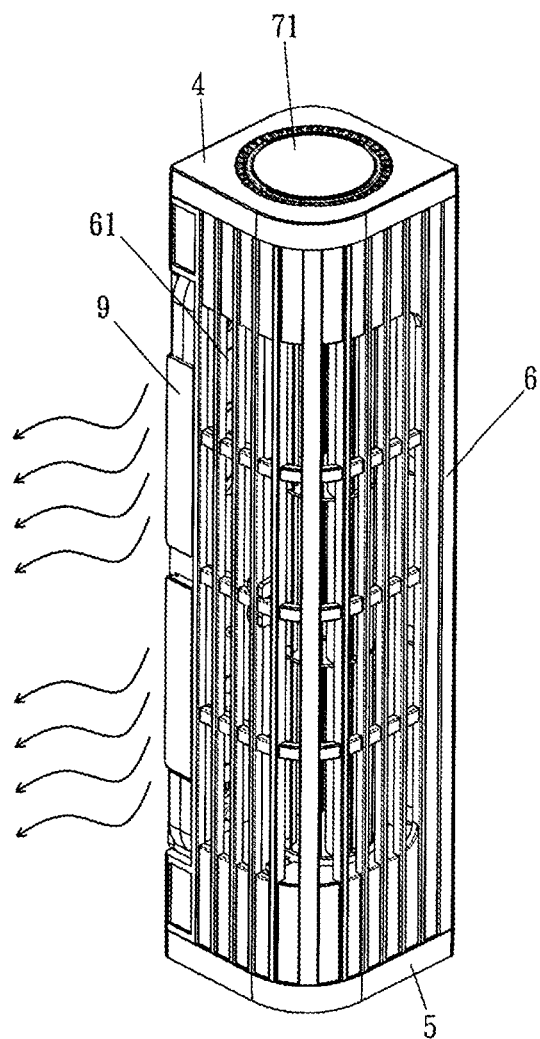
FIG. 3 is still another perspective view of the transverse fan assembly where the transverse fan assembly stands upright.
Figure 4:
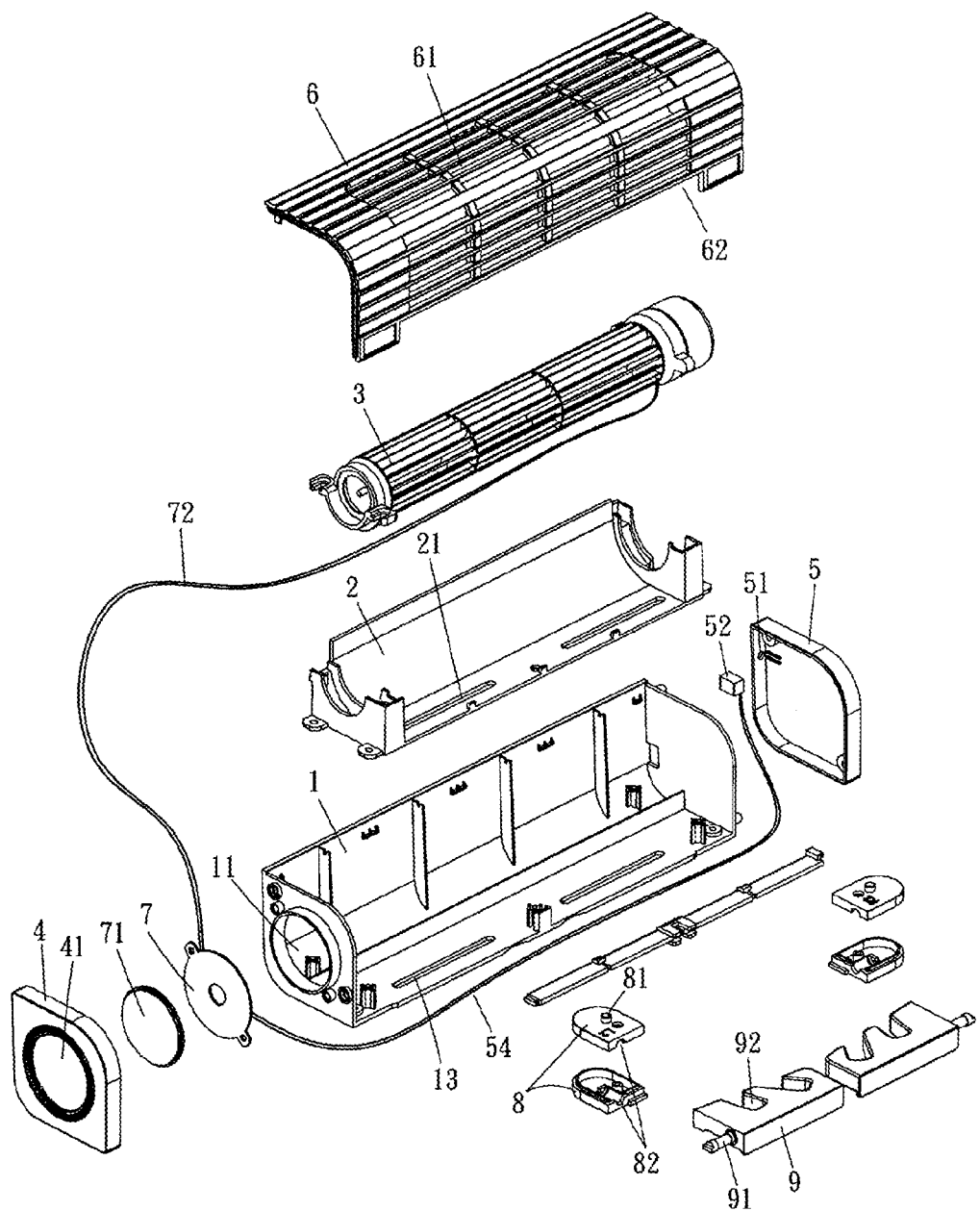
FIG. 4 is an exploded view of the transverse fan assembly.

Referring to FIGS. 1 to 12, a transverse fan assembly in accordance with the invention comprises the following components as discussed in detail below.

A housing 1 is open to top and front and includes a circular opening 11 on one side, and two spaced slits 13 on a bottom. A louver 6 is complimentarily mounted on the top and front of the housing 1 and includes a plurality of openings 61 and an elongated opening 62 on a lower portion of the front. Two spaced outtakes 12 are formed in the opening 62 when the louver 6 is mounted on the housing 1. A rectangular first cap 4 is mounted on one side of the assembled housing 1 and the louver 6 and includes a circular opening 41 aligned with the opening 11. A rectangular second cap 5 is mounted on the other side of the assembled housing 1 and the louver 6 and includes an opening 51 and a power cord socket 52 in the opening 51. A disc shaped printed circuit board (PCB) 7 is fastened onto the opening 11 and includes a touch screen 71 disposed adjacent to the PCB 7 and exposed at the opening 41, and a first electrical wire 72 interconnected the PCB 7 and a transverse fan 3 which is disposed in a mount 2.

A second electrical wire 54 is interconnected the PCB 7 and the power cord socket 52. Thus, mains electricity may be supplied to the PCB 7 when a plug 53 at one end of a power cord (not numbered) is inserted into the power cord socket 52 and the other end of the power cord is connected to, for example, a wall outlet. Thereafter, a user may press the touch screen 71 to electrically activate the PCB 7 to turn on the transverse fan 3, turn off the transverse fan 3, or adjust the rotation speed of the transverse fan 3.

The mount 2 includes two spaced slits 21 on a bottom. The slits 21 are aligned with the slits 13 when the mount 2 is mounted in the housing 1. Two pairs of pivotal sliding members 8 are provided. Each pivotal sliding member 8 includes a projection 81 moveable between two ends of the slits 21 or 13, and a groove 82. A hole is formed by the grooves 82 when either pair of the pivotal sliding members 8 is assembled. Two auxiliary supports 9 are disposed on the outtakes 12. Each auxiliary support 9 includes a shaft 91 rotatably mounted in the hole.

Figure 9:
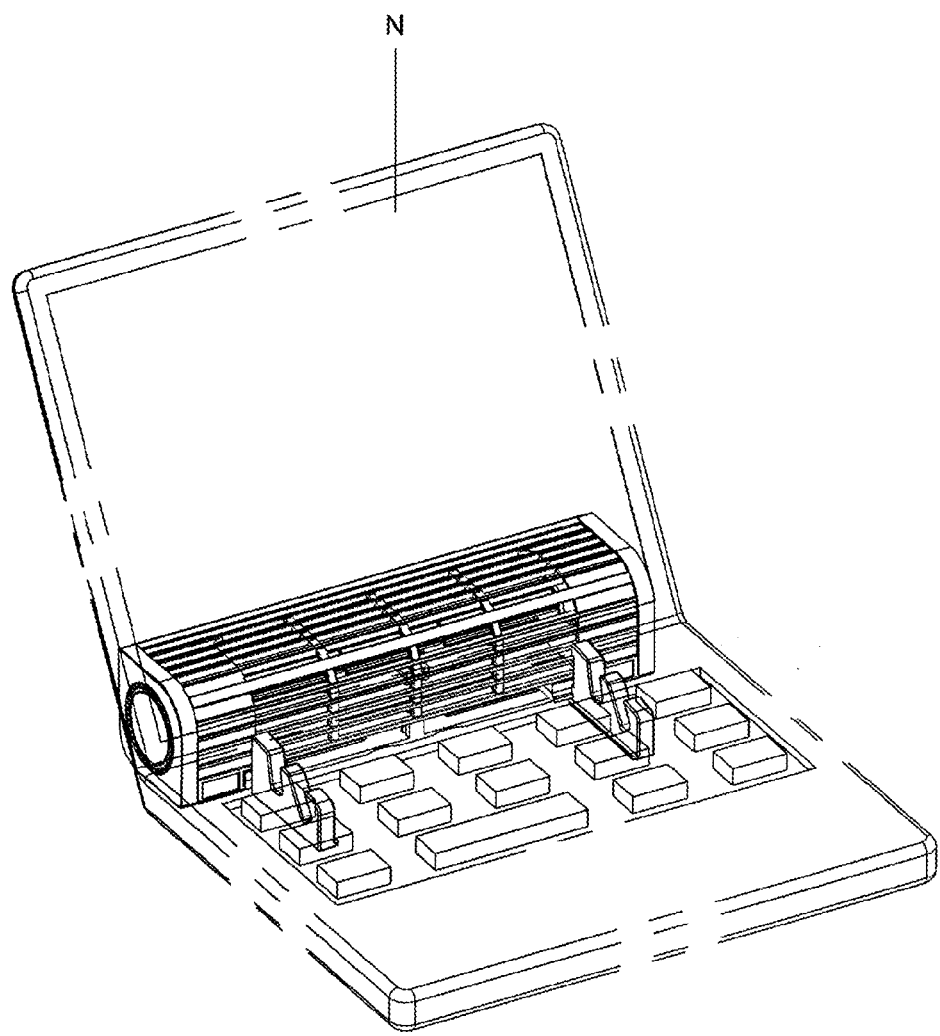
FIG. 9 is a perspective view showing the transverse fan assembly disposed behind a hinged portion of the display of a laptop in operation.

As shown in FIG. 9, the transverse fan assembly is disposed behind a hinged portion of the display of a laptop N for cooling purposes.

Figure 5:
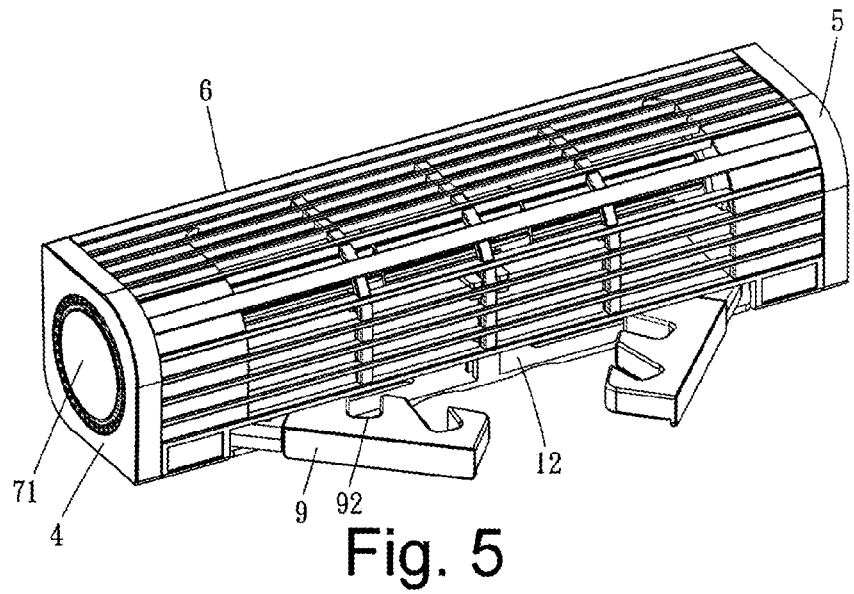
FIG. 5 is a perspective view of the transverse fan assembly where the auxiliary supports are pivoting outward.
Figure 6:
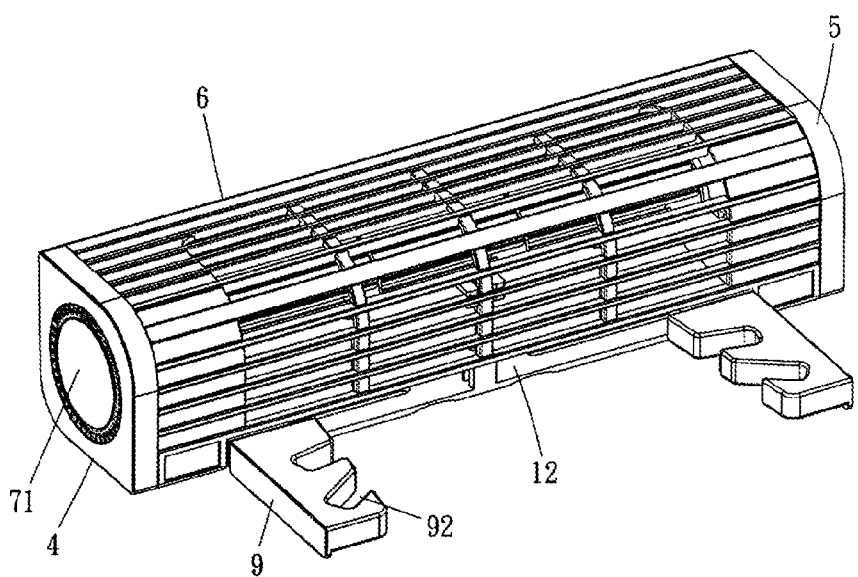
FIG. 6 is a view similar to FIG. 5 showing the 90-degree pivoted auxiliary supports.
Figure 7:
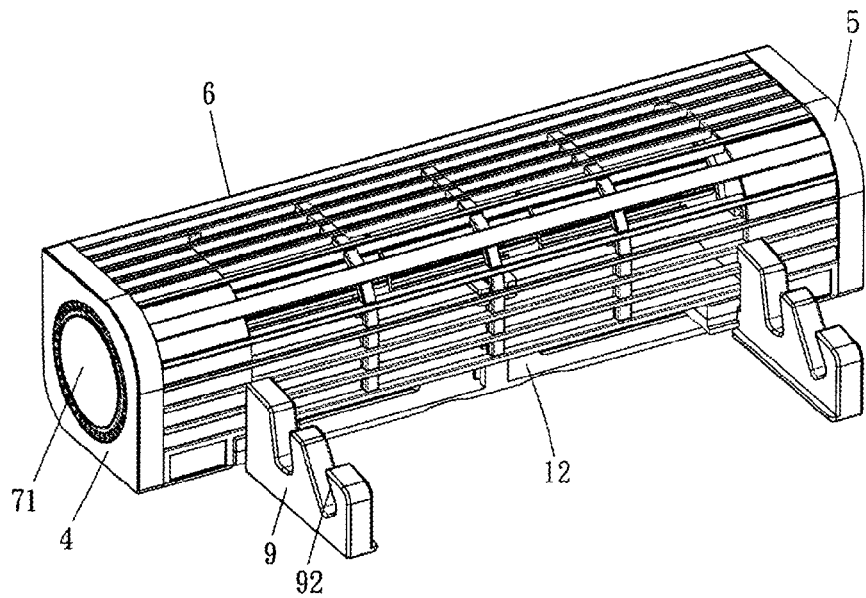
FIG. 7 is a view similar to FIG. 6 where the auxiliary supports have been rotated 90-degree upward.
Figure 8:
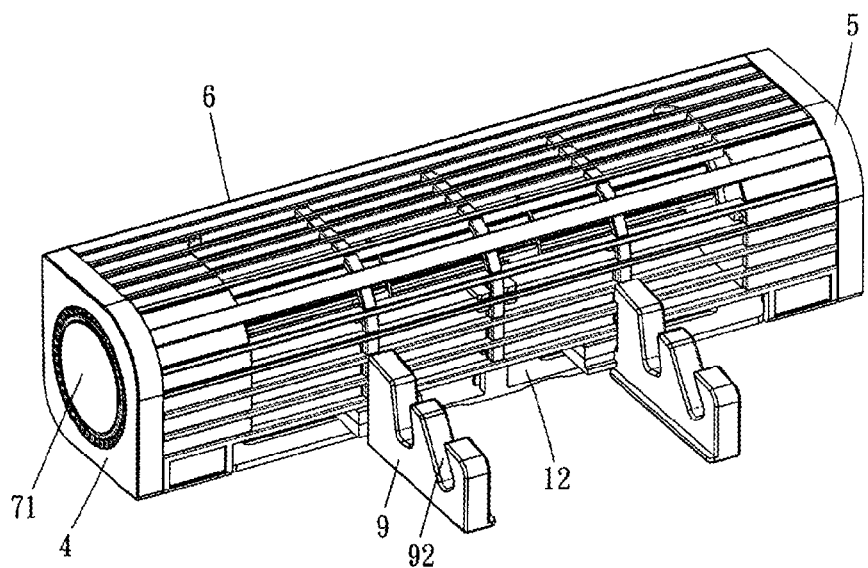
FIG. 8 is a view similar to FIG. 7 showing a distance between the auxiliary supports decreased after moving them toward each other.

In an operation of extending the auxiliary supports 9 for support a tablet computer P, a user may first pivot the auxiliary supports 9 about the projections 81 until being stopped (see FIGS. 5 and 6). Next, the user may upward pivot the auxiliary supports 9 until being stopped (see FIG. 7). Next, the user may push the auxiliary supports 9 toward each other by sliding the pivotal sliding members 8 toward each other along the slits 13, 21 (see FIG. 8). Thereafter, the user may dispose a lower portion of the tablet computer P across one set of the aligned slots 92 of the auxiliary supports 9 (see FIGS. 10 and 11). Alternatively, the user may dispose the lower portion of the tablet computer P across the other set of the aligned slots 92 of the auxiliary supports 9 (see FIG. 12).

While the invention has been described in terms of preferred embodiments, those skilled in the art will recognize that the invention can be practiced with modifications within the spirit and scope of the appended claims.

What is claimed is:

1. A fan assembly comprising:
   a housing having an open top and an open front and including two first slits on a bottom;
   a mount disposed on the bottom of the housing and including two second slits on a bottom, the second slits being aligned with the first slits;
   a louver disposed on the top and the front of the housing and including a plurality of openings and at least one outtake formed between the louver and the front of the housing;
   first and second side caps for fastening the housing and the louver together;
   a printed circuit board (PCB) disposed on a side of the housing;
   an exposed touch screen adjacent to the PCB and configured to activate the PCB;
   a transverse fan disposed in the mount and electrically connected to the PCB;
   two pivotal members each including two opposite projections slidably disposed in the first and second slits; and
   two auxiliary supports disposed on the at least one outtake, each of the auxiliary supports including a shaft configured to rotate in one of the pivotal members, and a plurality of slots.

* * * * *